United States Patent
Eramo, Jr. et al.

(10) Patent No.: US 6,265,132 B1
(45) Date of Patent: Jul. 24, 2001

(54) PHOTOIMAGEABLE COMPOSITION CONTAINING FLEXIBLE OLIGOMER

(75) Inventors: Lincoln Eramo, Jr., San Clemento; Mitchell G. Male, San Marcos; Robert K. Barr, Laguna Niguel, all of CA (US)

(73) Assignee: Rohm and Haas Company, Philadelphia, PA (US)

( * ) Notice: Subject to any disclaimer, the term of this patent is extended or adjusted under 35 U.S.C. 154(b) by 0 days.

(21) Appl. No.: 09/420,906

(22) Filed: Oct. 20, 1999

(51) Int. Cl.[7] .............................. G03F 7/028; G03F 7/033; G03F 7/038; C07C 67/52
(52) U.S. Cl. ..................... 430/280.1; 430/284.1; 525/451; 560/222; 560/221; 522/95
(58) Field of Search .................... 560/221, 222; 525/451; 430/284.1, 280.1; 522/95

(56) References Cited

U.S. PATENT DOCUMENTS

| | | | |
|---|---|---|---|
| 3,228,914 | 1/1966 | Saint-Friston et al. | 260/75 |
| 4,092,443 | 5/1978 | Green et al. | 427/53 |
| 4,202,950 | 5/1980 | Statton et al. | 525/123 |
| 4,590,144 | 5/1986 | Schornick et al. | 430/732 |
| 5,187,044 | 2/1993 | Prioleau et al. | 430/271 |
| 5,229,252 | 7/1993 | Flynn et al. | 430/280 |
| 5,364,736 | 11/1994 | Eramo et al. | 430/280 |
| 5,364,741 | 11/1994 | Huynh-Tran | 430/300 |
| 5,439,956 * | 8/1995 | Noguchi et al. | 522/97 |
| 5,470,689 * | 11/1995 | Wolf et al. | 430/269 |

\* cited by examiner

*Primary Examiner*—Cynthia Hamilton

(57) ABSTRACT

The invention provides an oligomer having tetraacrylate functionality which provides enhanced flexibility to photoimageable compositions which function as photoresists. The enhanced flexibility is particularly advantageous in epoxy-containing, solder mask-forming photoimageable composition, as this flexibility provides improved performance in nickel/gold plating.

6 Claims, No Drawings

PHOTOIMAGEABLE COMPOSITION CONTAINING FLEXIBLE OLIGOMER

The present invention is directed to photoimageable compositions useful as photoresists in the formation of electronic circuitry. Particularly advantageous aspects of the invention relate to photoresists used as solder masks, particularly solder masks which are subject to harsh processing conditions such as are encountered in nickel/gold electroless plating.

BACKGROUND OF THE INVENTION

Novel oligomers in accordance with the present invention provide flexibility to photo-imaged photoresists. This flexibility is desirable in all photoresist compositions, including primary imaging photoresists.

However, currently, tie most important benefits of the novel oligomers are in solder mask-forming photoimageable compositions. Such photoresists form a hard, permanent layer on a printed circuit board. A solder mask must be hard, durable, and resistant to chemicals, such as organic solvents and strong acids and bases. In this regard a solder mask should meet the standards of IPC/ANSI SM-840B Table 12 tests, Summary of Criteria for Qualification/Conformance (Institute for Interconnecting Circuits). Herein, a solder mask is defined as a layer which meets those tests. Examples of solder mask-forming compositions that are developable in alkaline aqueous solutions are U.S. Pat. Nos. 5,229,252 and 5,364,736, the teachings of each of which are incorporated herein by reference.

Previously, solder was applied directly to exposed pads of the copper electronic circuitry traces for electrical connection to surface mounts and the like. Problems with soldering directly to the circuitry traces include expense of the solder, toxicity of the solder, copper migration into the solder, and tarnishing of the solder. An improved process involves nickel/gold plating of the pads in preparation for electrical connection. The exposed pads are initially plated with nickel by an electroless process to a thickness of between about 100 and about 300 micro inches. Then a thin layer, e.g., 6 micro inches, of gold is plated over the nickel by an electroless process. Nickel/gold plating is advantageous in that the layers are planer and the nickel gold protects the copper from migrating. Also, the gold does not tarnish.

However, the electroless plating processes are harsh, requiring solder masks to stand up to the plating conditions. Particularly, nickel electroless plating is typically conducted at about 90° C. for 15 minutes. Often, lifting of the solder mask in the regions around the pads is observed.

Lower molecular weight binder polymers of solder mask-forming photoimageable compositions tend to shrink less during processing and result in less lifting of the solder mask. However, lower molecular weight binder polymers tend to be tacky, a trait undesirable because contact imaging, i.e., direct contact between the artwork and the photoimageable composition, is required for maximum resolution.

Higher molecular weight binder polymers reduce tack but shrink more, resulting in a greater amount of solder mask lifting during nickel/gold plating.

The present invention is directed to flexible photopolymerizeable oligomers which reduce the effect of property trade-offs, such as tack versus lifting in a solder mask composition exposed to nickel/gold plating.

SUMMARY OF THE INVENTION

The invention provides an oligomer having tetra-acrylate functionality for efficient photopolymerization as well as flexibility. The acrylate-functional oligomer may be advantageously used in primary imaging resists. Most significant advantages of the oligomer, however, are currently seen in use in solder mask-forming photoimageable compositions, particularly in compositions which form solder masks that are subsequently exposed to nickel/gold plating or similar harsh processing conditions.

The oligomer of the present invention has the general formula (I):

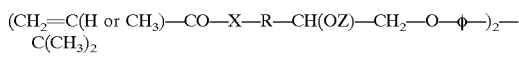

where
- R is an alkylene group of from 1 to 40 carbons;
- X is nothing or a diol selected from the group consisting of alkylene diols, polyester diols and polyether diols of molecular weight between 50 and 2,800; and
- Z has the formula:

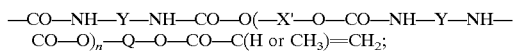

where
- the Ys are alkylene or aromatic hydrocarbon groups;
- n=1–4, preferably 1;
- X' is a diol selected from the group consisting of alkylene diols, polyester diols, and polyether diols; and
- Q in an alkylene group of 2 to 6 carbon atoms.

Primary imaging photoresist in accordance with the invention include, based on weight of (A) plus (B);

(A) between about 30 and about 80 weight percent binder polymer having sufficient carboxylic acid functionality such that the photoresist is developable in alkaline aqueous solution;

(B) between about 20 and about 70 weight percent of a photopolymerizeable component comprising α,β-ethylenically unsaturated oligomers and optional additional α,β-ethylenically unsaturated monomers, at least about 2 weight percent, preferably at least about 35 weight percent, based on total weight of (A) plus (B) comprising oligomer of formula (I); and (C) between about 0.1 and about 10 weight percent of a photoinitiator chemical system.

Photoimageable compositions which are to intended to provide permanent layers, such as solder masks, further comprise, in a part separate from (A), (D) between about 5 and about 40 weight percent based on total weight of (A) plus (B) an epoxy resin. Compositions containing (D) preferably also contain (E) between about 1 and about 10 weight percent based on total weight of (A) plus (B) of an epoxy cross-linking agent and/or an epoxy cure catalyst.

DETAILED DESCRIPTION OF CERTAIN PREFERRED EMBODIMENTS

The novel oligomers of the present invention are conveniently prepared from commercially available bisphenol A epoxy acrylates having the general formula (II): $(CH_2=C(H$ or $CH_3)—CO—X—R—CH(OH)—CH_2—O—\phi—)_2—C(CH_3)_2$ where X and R are as defined above. Such bisphenol A epoxy acrylates have molecular weights ranging from about 500 to about 1500. Commercial examples of such compounds include Novacure® 3701, Ebecryl® 600 and ECN® 117. While these commercial compounds have diacrylate functionality, they do not enjoy great use in present day photoimageable compositions, primarily because they have relatively high molecular weights per acrylate functionality and, if used in photoimageable compositions, provide insufficient photospeed. In accordance with the invention, these bisphenol A epoxy acrylates are modified to provide additional acrylate functionality in oligomer molecules that allow the acrylate functionalities to enter into the photopolymerization reaction without stearic hindrance so as to provide adequate photospeed. At the same time, the oligomers of the present invention are flexible, providing flexibility to photoimaged compositions. This flexibility, in particular, helps to reduce solder mask lifting under harsh processing conditions, such as in nickel/gold plating. Accordingly, higher molecular weight binder polymers can be utilized, thereby reducing tack. Thus, preferred solder mask compositions in accordance with the invention can be contact-imaged, have adequate photospeed, and withstand nickel/gold plating conditions.

It is to be noted in formula (II) that in addition to the two acrylate functionalities of the bisphenol A epoxy acrylates, the compounds have two hydroxy functionalities through which group Z of formula (I) is attached, adding two additional acrylate functionalities.

In the currently preferred synthetic route, the bisphenol A epoxy acrylate is reacted with a diisocyanate, two moles of diisocyanate being reacted so as to link at one end to each of the hydroxy functionalities and provide two isocyanate moieties available for further reaction. The diisocyanate may be any commonly available diisocyanate, such as hexamethylene diisocyanate (HDI), isophorone diisocyanate (IPDI), methylene diisocyanate (MDI), methylenebiscyclohexylisocyanate, trimethylhexamethyl diisocyanate, hexane diisocyanate, hexamethylamine diisocyanate, methylenebiscyclohexyl isocyanate, toluene diisocyanate, 1,2-diphenylethane diisocyanate, 1,3-diphenylpropane diisocyanate, diphenylmethane diisocyanate, dicyclohexylmethyl diisocyanate, etc. Preferably, for maximum flexibility of the oligomer, the diisocyanate is an aliphatic diisocyanate such as HDI. At this point, the molecule has diisocyanate functionality.

The chain is then extended by reacting the molecule with two moles of a diol, such as hexane diol; a polyalkylene glycol such as polyethylene glycol or polypropylene glycol; or a hydroxy functional polyester oligomer. At this stage of synthesis, the molecule again has dihydroxy functionality.

The chain is then further extended by again reacting it with two moles of diisocyanate, again giving the molecule diisocyanate functionality.

At this stage, the chain can be further extended by alternately reacting diols and diisocyanates. However, it is generally not desired to further increase the molecular weight as this tends to reduce photospeed without corresponding enhancement of oligomer flexibility.

Rather, at this stage, the diisocyanate functional oligomer is acrylate-capped by reaction with two moles of a hydroxy-functional (meth)acrylate, such as hydroxyl ethyl methacrylate or 4-hydroxy butyl acrylate (4HBA). The oligomer, thus synthesized, has 4 acrylate functionalities sufficiently spaced from one another so as to be able to react freely in a photopolymerization reaction. The molecular weight of the completed oligomer is between about 500 and about 2,000.

The binder polymer is conventionally formed from $\alpha,\beta$-ethylenically unsaturated monomers. Some specific examples of suitable acid functional monomers are acrylic acid, methacrylic acid, maleic acid, fumaric acid, citraconic acid, 2-hydroxyethyl acrylolyl phosphate, 2-hydroxypropyl acrylol phosphate, 2-hydroxy-alpha-acryloyl phosphate, etc. One or more of such acid functional monomers may be used to form the binder polymer. The acid functional monomers may be copolymerized with non-acid functional monomers, such as esters of acrylic acids, for example, methyl acrylate, methyl methacrylate, hydroxy ethyl acrylate, butyl methacrylate, octyl acrylate, 2-ethoxy ethyl methacrylate, t-butyl acrylate, 1,5-pentanediol diacrylate, N,N-diethylaminoethyl acrylate, ethylene glycol diacrylate, 1,3-propanediol diacrylate, decamethylene glycol diacrylate, decamethylene glycol dimethacrylate, 1,4-cyclohexanediol diacrylate, 2,2-dimethylol propane diacrylate, glycerol diacrylate, tripropylene glycol diacrylate, glycerol triacrylate, 2,2-di(p-hydroxyphenyl)-propane dimethacrylate, triethylene glycol diacrylate, polyoxyethyl-2-2-di(p-hydroxyphenyl)-propane dimethacrylate, triethylene glycol dimethacrylate, polyoxypropyltrimethylol propane triacrylate, ethylene glycol dimethacrylate, butylene glycol dimethacrylate, 1,3-propanediol dimethacrylate, butylene glycol dimethacrylate, 1,3-propanediol dimethacrylate, 1,2,4-butanethiol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, and 1,4-benzenediol dimethacrylate; styrene and substituted styrene, such as 2-methyl styrene and vinyl toluene and vinyl esters, such as vinyl acrylate and vinyl methacrylate to provide the desired acid number.

If a higher cross-linking density is desired of the photo-imaged composition, the binder polymer (A) may be provided with acrylate functionality, such as is described in U.S. Pat. No. 5,698,370. In this patent, maleic anhydride moieties in the backbone of the polymer are half esterified with a hydroxy functional acrylate, such as hydroxy ethyl (meth)acrylate or 4-hydroxy butyl (meth)acrylate.

The molecular weight (weight average) of the binder polymer may range from about 20,000 to about 200,000. For primary imaging resists the weight average molecular weight is preferably between about 80,000 and about 150,000. For solder mask-forming compositions the preferred weight average molecular weight is between about 2,000 and about 100,000. In order that the compositions be developable in alkaline aqueous solution, the acid number should be between about 120 and about 300, preferably between about 150 and about 250.

To produce the image, this negative-acting photoimageable composition contains the photopolymerizeable component (B) which includes the oligomers of formula (I) above. Oligomers of formula (I) may comprise the entirety of photopolymerizeable component (B), or component (B) may contain additional $\alpha,\beta$-ethylenically unsaturated oligomers and monomers.

Useful photopolymerizeable monomers which may used in conjunction with the oligomer of formula (I) include those multi-functional monomers, listed above, used to form the binder polymers. Some particularly suitable multi functional acrylic monomers, are as tetra ethylene glycol diacrylate (TEGDA), trimethylol propane triacrylate (TMPTA), butanediol dimethacrylate (BDDMA) and pentaerythritol triacrylate (PETA).

Also, the photopolymerizeable component (B) may contain additional multi functional oligomers, such as previously described epoxy-acrylate oligomers. These are described, for example, in U.S. Pat. No. 5,229,252, the teaching of which are incorporated herein by reference. Herein, the term "oligomers" is used to designate short chain polymers having molecular weights between 500 and about 5000. For purpose of description of photopolymerizeable component (B), component (B) does not include high molecular binder polymers (A), even if such binder polymers have $\alpha,\beta$-ethylenic unsaturated moieties and thereby enter into the photoimaging polymerization reaction.

To initiate polymerization of the monomers and/or oligomers upon exposure to actinic radiation, the photoimageable composition contains C) an appropriate photoinitiator(s) or photoinitiator chemical system. Suitable photoinitiators include benzoin ethers, benzil ketals, acetophenones, benzophenones and related compounds with amines. Preferred initiators are thioxanthones, e.g., 2-isopropyl thioxanthones, particularly in conjunction with an amine.

The components of a primary imaging photoresist in accordance with the invention are typically diluted in a suitable solvent such as methyl ethyl ketone. Likewise, in a solder mask composition, typically provided as a two part system, the portion containing the binder (A), photopolymerizeable component (B) and photoinitiator chemical system (C) is dissolved in an organic solvent. For solder mask-forming compositions, epoxy resins are generally available which are liquid and have sufficiently low viscosity such they can be used without dilution in organic solvent, although, of course, solvents may be used with epoxy resins to adjust viscosity.

For solder mask-forming compositions, the composition further includes D) an epoxy resin or resins. The epoxy resin imparts the excellent hardness and durability to the coating after development and final curing of the epoxy resin or mixture of epoxy resins.

A wide variety of epoxy resins are suitable for use in accordance with the present invention. Typically, epoxies of the Bisphenol A, Novalac and phenol cresol types are used. Other suitable epoxy resins are described, for example, in U.S. Pat. No. 4,092,443, the teachings of which are incorporated herein by reference. Cycloaliphatic epoxides, such as those sold under the trade names Cyanacure® UVR-6100 and UVR-6110 by Union Carbide, Danbury, Conn. are also useful. Epoxy resins used in accordance with the invention preferably have epoxide equivalent weights of between 100 and about 700.

After the photoimageable composition of the present invention is exposed to actinic radiation and developed in alkaline aqueous solution, such as 1% sodium carbonate, the epoxy is cured to render the photoimageable layer hard and permanent. Although epoxy resins are self-cross-linking, to obtain a sufficiently rapid thermal cure for practical application, it is generally necessary to include E) an epoxy curative, i.e., a compound which enters into the cross-linking reaction and/or an epoxy cure catalyst.

Examples of epoxy curatives are anhydrides of multi functional carboxylic acids and blocked isocyanates, such as $\epsilon$-caprolactam-blocked isophorone. Examples of epoxy cure catalysts include amines, such as triethylene amine and dicyanodiamide.

So that the epoxy resin does not pre-maturely cure, it is generally the case that the composition of the present invention be provided as a two-part composition. The acid-functional binder polymer and the epoxy curative and/or cure catalyst are provided in a part kept separate from the epoxy until just prior to use. Current practice is that all components except the epoxy resin be in a first part and the epoxy resin be provided as a second part.

The composition may also contain additional materials, such as pigments and co-solvents, as is conventional in the art. Many compositions of this type are pigmented, typically containing dispersed pigment at levels of up to about 3.0 wt % relative to total weight of (A) plus (B).

The compositions of the present invention are applied in a conventional manner as a liquid compositions directly to a printed circuit board. After coating, the composition is dried to remove water and also to remove volatiles, such as the cosolvent used as coalescing agents. As the photoimageable composition dries, the system coalesces into a continuous film. Drying is preferably carried out at somewhat elevated temperatures, both to hasten removal of the water and other volatiles. Preferably, drying is carried out at a temperature of between about 65 and about 80° C.

Processing is in a conventional manner. In a typical procedure, a photoimageable composition layer formed from a liquid composition, is applied to a printed circuit board. The photoimageable composition layer is exposed to actinic radiation through appropriate artwork. Exposure to actinic radiation polymerizes the monomers or oligomers in the light-exposed areas, resulting in a cross-linked structure that is resistant to developer. Next, the composition is developed in dilute alkaline aqueous solution, such as a 1% sodium carbonate solution. The alkali solution causes salt formation with the acidic groups of the binder polymers, rendering them soluble and removable.

If the composition is a solder mask-forming composition, after development, the printed circuit board is heated, typically to a temperature of between about 140 and about 160° C. for sufficient time to effect a cure of the epoxy resin and thereby render the layer hard and permanent.

Current formulations are particularly adapted for spray application. Other means of application, such as curtain coating may require higher viscosities. For such purposes, thickeners may be added, such as polyurethane thickeners, as described in U.S. Pat. No. 5,364,737, the teachings of which are incorporated herein by reference.

The Invention will now be described in greater detail by way of specific examples.

EXAMPLE 1

Formation of Oligomers

Starting with commercial epoxy acrylates Ebecryl®-600 (to produce oligomer designated R-M942) and with ECN®-117 (to produce oligomer designated R-M938) the molecules are reacted successively with 2 moles of HDI; 2 moles of polypropylene glycol, MW 1000; 2 moles HDI; and 2 moles of HEMA, thereby producing oligomers having tetra acrylate functionality.

EXAMPLE 2

Two solder mask formulations designated #2415-25 and #2415-31 were formulated as set forth in the tables below. The solder mask formulations are liquid and may be applied by curtain coating.

| Chemical | Solid % (A + B) | Chemical % Solids | Total Wet % (Part A + B) | Wet % (Part A) | Solvent (g) | Amount (g) |
|---|---|---|---|---|---|---|
| Part A |  |  |  |  |  |  |
| R-I713-17 | 28.08 | 60.06 | 28.05 | 37.40 | 44.82 | 112.21 |
| R-M945 | 8.89 | 41.40 | 12.88 | 17.18 | 30.20 | 51.54 |
| R-M942 | 5.00 | 41.40 | 7.25 | 9.66 | 16.99 | 28.99 |

-continued

| | | | | | | |
|---|---|---|---|---|---|---|
| SR-454 | 1.90 | 41.40 | 2.75 | 3.67 | 6.45 | 11.01 |
| BB-3056 | 0.48 | 100.00 | 0.29 | 0.38 | 0.00 | 1.15 |
| Modaflow | 2.85 | 100.00 | 1.71 | 2.28 | 0.00 | 6.84 |
| I-907 | 3.80 | 100.00 | 2.28 | 3.04 | 0.00 | 9.12 |
| ITX | 1.22 | 100.00 | 0.73 | 0.98 | 0.00 | 2.93 |
| Sun Green | 1.88 | 100.00 | 1.13 | 1.50 | 0.00 | 4.51 |
| Huber 90C | 17.40 | 100.00 | 10.44 | 13.92 | 0.00 | 41.76 |
| MY24 | 0.21 | 100.00 | 0.13 | 0.17 | 0.00 | 0.50 |
| CG1400 | 1.04 | 100.00 | 0.62 | 0.83 | 0.00 | 2.50 |
| HP-270 | 4.75 | 100.00 | 2.85 | 3.80 | 0.00 | 11.40 |
| 3-MB | 0.00 | 0.00 | 3.89 | 5.18 | 15.54 | 15.54 |
| | | | 75.00 | 100.00 | | 300.00 |
| Part B | | | | | | |
| DER 331 | 11.25 | 100.00 | 6.75 | 27.00 | 0.00 | 27.00 |
| ECN-1299 | 11.25 | 50.00 | 13.50 | 54.00 | 27.00 | 54.00 |
| DBE | 0.00 | 0.00 | 4.75 | 19.00 | 19.00 | 19.00 |
| TOTAL | 100.00 | | 25.00 | 100.00 | 160.00 | 100.00 |

| | |
|---|---|
| Part A (g) | 300.00 |
| Total A + B (g) | 400.00 |
| % Solids | 60.00 |
| Mix Ratio A:B | 3.00 |
| 1713-17 | A binder produced by Morton International Organic Synthesis department having both acid and acrylate functionality. R-1713 is the product of a condensation reaction between Radicure ®'s Ebecryl ®600 epoxy diacrylate oligomer and Epiclon ® B-4400 dianhydride at a 1.0:0.6 mole ratio. The binder is PMA solvent at approximately 60% solids with an average Mw of 3300. (The "-17" designates 17th batch prepared). |
| R-M945 | methyl methacrylate 50 mole %, methacrylic acid 50 mole %, methacrylic acid 25% esterified with HEMA hydroxyethyl acrylate; acid no. 125-150 |
| SR-454 | methacrylated trimethylol propane triacrylate |
| BB-3056 | bubble breaker |
| Modaflow | flow control agent |
| Irgacure-907 | photoinitiator |
| ITX | photoinitiator |
| Sun Green | pigment |
| Huber 90C | filler |
| MY24 | curing agent |
| CG1400 | dicyanodiamide, curing agent |
| HP-270 | fumed silica, filler |
| 3-MB | 3-methoxy butanol, solvent |
| DER 331 | bisphenol A epoxy (liquid) |
| ECN-1299 | Novalac epoxy |
| DBE | Dibasic ester solvent with a B.P. of 196–225° C. |

| Chemical | Solid % (A + B) | Chemical % Solids | Total Wet % (Part A + B) | Wet % (Part A) | Solvent (g) | Amount (g) |
|---|---|---|---|---|---|---|
| Part A | | | | | | |
| LSF-60 | 31.60 | 45.30 | 43.60 | 54.50 | 89.43 | 163.49 |
| RM938 | 10.00 | 53.95 | 11.58 | 14.48 | 20.01 | 43.44 |
| TMPTA | 6.00 | 100.00 | 3.75 | 4.69 | 0.00 | 14.06 |
| Modaflow | 1.00 | 100.00 | 0.63 | 0.78 | 0.00 | 2.34 |
| Phenyl Acri. | 3.25 | 100.00 | 2.03 | 2.54 | 0.00 | 7.62 |
| Sun Green | 2.50 | 100.00 | 1.56 | 1.95 | 0.00 | 5.86 |
| Minex 10 | 20.04 | 100.00 | 12.53 | 15.66 | 0.00 | 46.97 |
| MY24 | 0.20 | 100.00 | 0.13 | 0.16 | 0.00 | 0.47 |
| CG1400 | 1.00 | 100.00 | 0.63 | 0.78 | 0.00 | 2.34 |
| HP-270 | 4.00 | 100.00 | 2.50 | 3.13 | 0.00 | 9.38 |
| PMA | 0.00 | 0.00 | 1.07 | 1.34 | 4.02 | 4.02 |
| | | | 80.00 | 100.00 | | 300.00 |
| Part B | | | | | | |
| DER-331 | 15.41 | 100.00 | 9.63 | 48.16 | 0.00 | 36.12 |
| DER-337 | 5.00 | 100.00 | 3.13 | 15.63 | 0.00 | 11.72 |

-continued

| | | | | | |
|---|---|---|---|---|---|
| PMA | 0.00 | 0.00 | 7.24 | 36.22 | 27.16 | 27.16 |
| TOTAL | 100.00 | | 20.00 | 100.00 | 140.63 | 75.00 |

| | |
|---|---|
| Part A (g) | 300.00 |
| Total A + B (g) | 375.00 |
| % Solids | 62.50 |
| Mix Ratio A:B | 4.00 |
| LSF 60 | A polymer Acid no. 125-150 prepared by reacting 55 wt % styrene, 35 wt % methacrylic acid, and 10 wt % n-hexylmethacrylate. LSF-60 is made in 3-methoxybutanol solvent at approximately 45% solids and has a Mw of approximately 23,000 |
| Minex 10 | filler |
| PMA | propylene glycol monomethyl ether acetate (solvent) |

What is claimed is:

1. An oligomer having the formula:

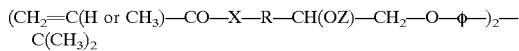

where

R is an alkylene group of from 1 to 40 carbons;

X is nothing or a diol selected from the group consisting of alkylene diols, polyester diols and polyether diols of molecular weight between 50 and 2,800; and Z has the formula:

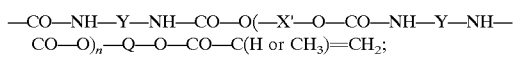

where the Ys are alkylene or aromatic hydrocarbon groups;

n=1–4;

X' is a diol selected from the group consisting of alkylene diols, polyester diols, and polyether diols; and Q in an alkylene group of 2 to 6 carbon atoms.

2. The oligomer of claim 1 where n=1.

3. A photoimageable composition comprising:

(A) between about 30 and about 80 weight percent binder polymer having sufficient acid functionality such that the photoresist is developable in alkaline aqueous solution;

(B) between about 20 and about 70 weight percent of a photopolymerizeable component comprising α,β-ethylenically unsaturated oligomers and optional additional α,β-ethylenically unsaturated monomers, at least about 2 weight percent, based on total weight of (A) plus (B) comprising the oligomer (I) of claim 1; and (C) between about 0.1 and about 10 weight percent of a photoinitiator chemical system.

4. The photoimageable composition of claim 3 wherein said oligomer (I) comprises at least about 35 wt. % based on total weight of (A) plus (B).

5. The photoimageable composition of claim 3 further comprising between about 5 and about 40 wt. % of (D) an epoxy resin, based on total weight of (A) plus (B).

6. The photoimageable composition of claim 5 further comprising between about 1 and about 10 wt %, based on total weight of (A) plus (B) of (E) an epoxy curative and/or epoxy cure catalyst.

* * * * *